(12) United States Patent
Gautier et al.

(10) Patent No.: US 9,544,406 B2
(45) Date of Patent: Jan. 10, 2017

(54) ELECTRONIC DEVICE INCLUDING AUTOMATIC GAIN ADJUSTMENT FOR HEARING AID COMPATIBILITY

(75) Inventors: Roberto Gautier, Davie, FL (US); Jay Robert Spoto, Boynton Beach, FL (US); Randall Scott Fraser, Plantation, FL (US)

(73) Assignee: BlackBerry Limited, Waterloo, Ontario (CA)

( * ) Notice: Subject to any disclaimer, the term of this patent is extended or adjusted under 35 U.S.C. 154(b) by 1081 days.

(21) Appl. No.: 12/945,457

(22) Filed: Nov. 12, 2010

(65) Prior Publication Data

US 2011/0201393 A1 Aug. 18, 2011

Related U.S. Application Data

(60) Provisional application No. 61/304,555, filed on Feb. 15, 2010.

(51) Int. Cl.
| | | |
|---|---|---|
| *H04M 1/02* | (2006.01) | |
| *H04M 1/725* | (2006.01) | |
| *H03G 3/32* | (2006.01) | |
| *H04R 25/00* | (2006.01) | |

(52) U.S. Cl.
CPC .............. *H04M 1/0235* (2013.01); *H03G 3/32* (2013.01); *H04M 1/72591* (2013.01); *H04R 25/554* (2013.01); *H04M 1/0245* (2013.01)

(58) Field of Classification Search
CPC ..... H03G 3/32; H04M 1/0235; H04M 1/0245; H04M 1/72591; H04R 25/554
USPC .............. 381/71.6, 312, 314, 315, 317, 320, 321,381/328, 370, 379; 455/41.2, 42, 43, 46, 63.1, 455/501, 550.1, 575.1, 575.4
See application file for complete search history.

(56) References Cited

U.S. PATENT DOCUMENTS

| | | | |
|---|---|---|---|
| 7,397,926 B1 | 7/2008 | Frerking | |
| 7,706,556 B2 | 4/2010 | Qi et al. | |
| 2006/0258414 A1 | 11/2006 | Vance et al. | |
| 2007/0003088 A1 | 1/2007 | Lehtola | |
| 2007/0009125 A1 * | 1/2007 | Frerking et al. ............... | 381/315 |
| 2007/0116308 A1 | 5/2007 | Zurek et al. | |
| 2007/0164910 A1 | 7/2007 | Qi et al. | |
| 2007/0238483 A1 * | 10/2007 | Boireau et al. ............ | 455/553.1 |
| 2009/0088098 A1 * | 4/2009 | Xu et al. ..................... | 455/127.2 |
| 2009/0124306 A1 | 5/2009 | Kim et al. | |
| 2009/0305755 A1 * | 12/2009 | Lee et al. .................... | 455/575.4 |

(Continued)

FOREIGN PATENT DOCUMENTS

| | | |
|---|---|---|
| EP | 1677426 | 7/2006 |
| EP | 2031837 | 3/2009 |

(Continued)

OTHER PUBLICATIONS

Office Action mailed May 27, 2013, in corresponding Canadian Patent Application No. 2,731,744.

(Continued)

*Primary Examiner* — Dinh P Nguyen
(74) *Attorney, Agent, or Firm* — Fish & Richardson P.C.

(57) ABSTRACT

In some aspects, a portable electronic device having a slidable upper housing and rear housing movable between an open position and a closed position, and a gain adjustment module. The gain adjustment module reduces the RF energy produced by the portable electronic device when the device is in the open position to ensure that the portable electronic device complies with Hearing Aid Compatibility (HAC) standards.

14 Claims, 11 Drawing Sheets

(56) References Cited

U.S. PATENT DOCUMENTS

2010/0137042 A1* 6/2010 Na et al. .................... 455/575.5
2010/0304801 A1* 12/2010 Giustina .................... 455/575.4

FOREIGN PATENT DOCUMENTS

EP       2061667      5/2009
WO    2006135801   12/2006

OTHER PUBLICATIONS

English abstract of EP2061667, published on May 27, 2009 and retrieved on Aug. 16, 2013.

* cited by examiner

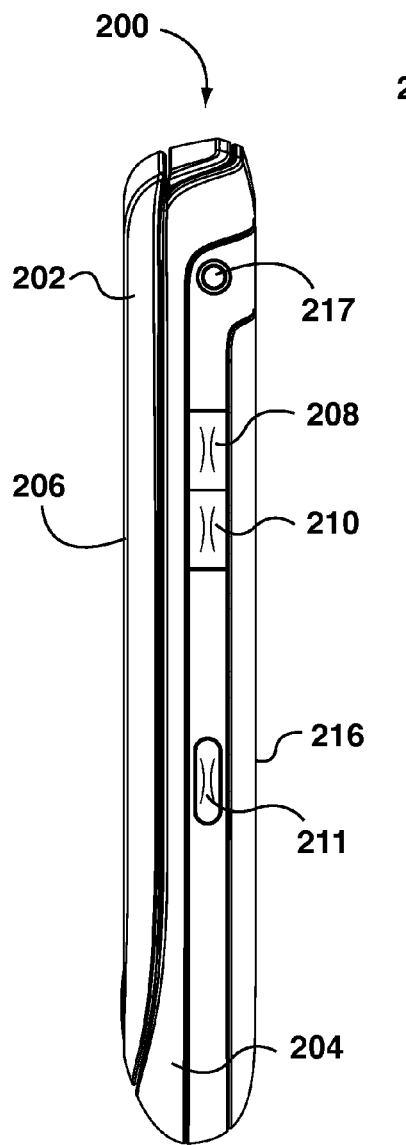
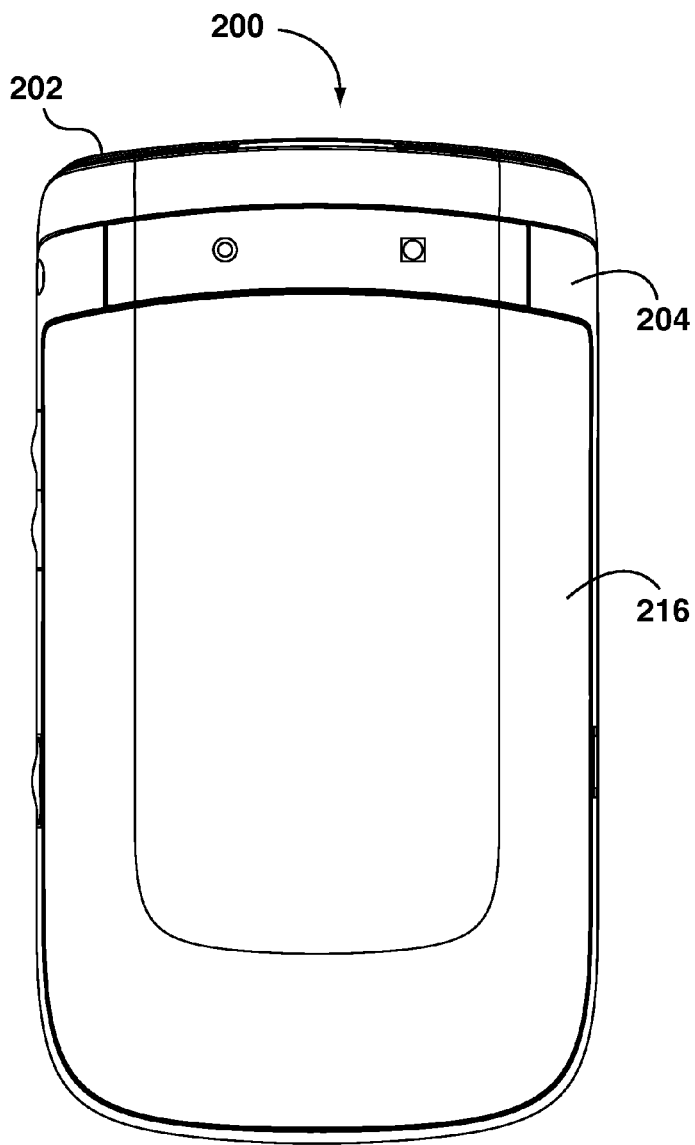
FIG. 4  FIG. 5

ELECTRONIC DEVICE INCLUDING AUTOMATIC GAIN ADJUSTMENT FOR HEARING AID COMPATIBILITY

RELATED APPLICATIONS

This application claims the benefit of U.S. Provisional Patent Application Ser. No. 61/304,555 filed Feb. 15, 2010, the entire contents of which are hereby incorporated by reference herein for all purposes.

FIELD

The embodiments herein relate to portable electronic devices, and in particular to portable electronic devices having a slidable upper housing and rear housing movable between an open position and a closed position, and including a gain adjustment module operable to provide compliance with Hearing Aid Compatibility (HAC) standards.

INTRODUCTION

Electronic devices, including portable electronic devices, have gained widespread use and may provide a variety of functions including, for example, telephonic, electronic text messaging and other personal information manager (PIM) application functions. Portable electronic devices can include several types of devices including mobile stations such as cellular phones, smart phones, Personal Digital Assistants (PDAs), tablet computers and laptop computers.

Devices such as PDAs or smart phones are generally intended for handheld use and ease of portability. Smaller devices are generally desirable for portability. Touch-sensitive displays include a display, such as a liquid crystal display (LCD), with a touch-sensitive overlay. Touch-sensitive displays may be useful on handheld devices as such handheld devices are often small and are limited in space available for user input devices.

BRIEF DESCRIPTION OF THE DRAWINGS

Embodiments of the present disclosure will now be described, by way of example only, with reference to the attached Figures, wherein:

FIG. 4 is a second side view of the portable electronic device of FIG. 2;

FIG. 5 is a back view of the portable electronic device of FIG. 2;

DETAILED DESCRIPTION

Figure 1:
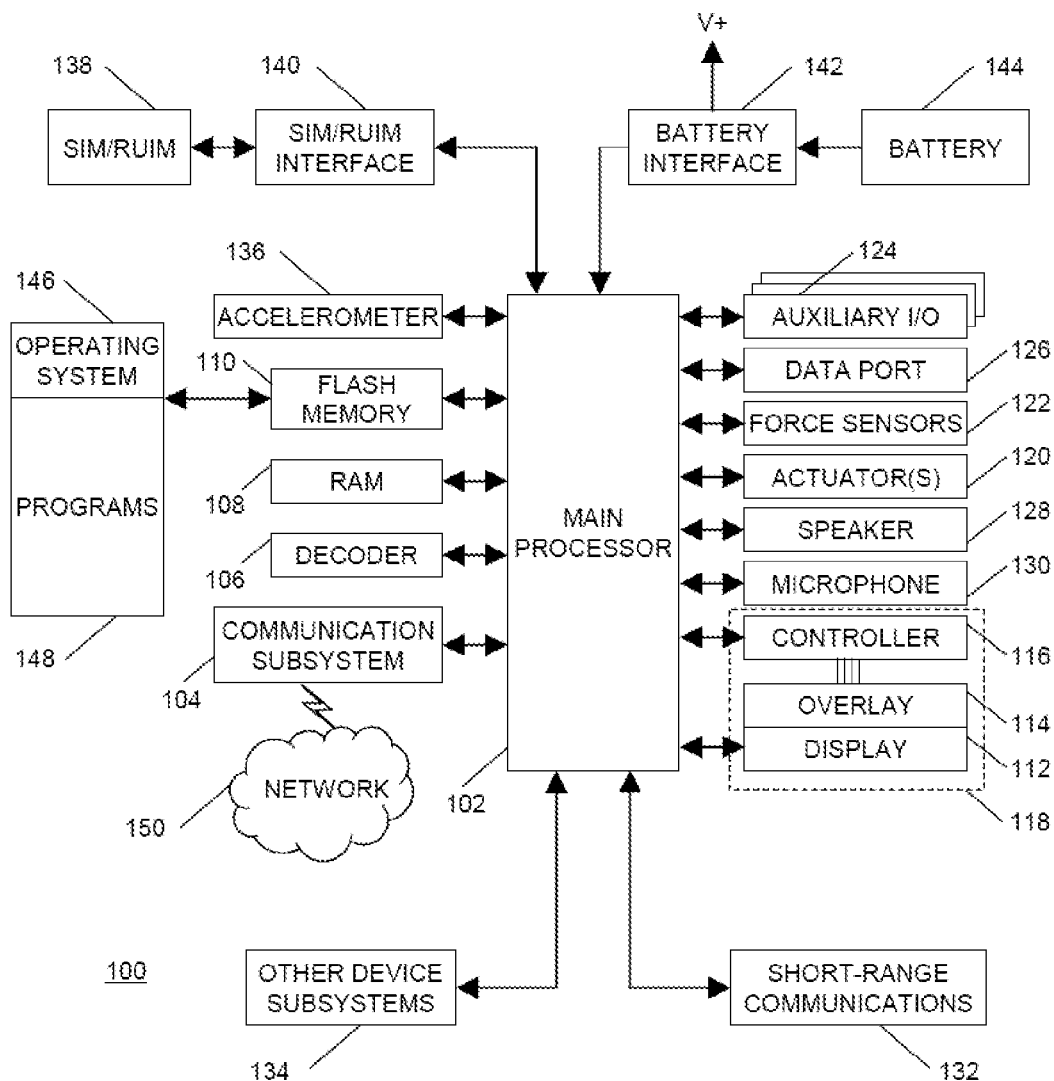
FIG. 1 is a simplified block diagram of components including internal components of a portable electronic device according to one embodiment.

Embodiments herein include an electronic device that includes a housing, a touch-sensitive display exposed by a front of the housing, and functional components comprising memory and a processor coupled to the memory and the touch-sensitive display.

It will be appreciated that for simplicity and clarity of illustration, where considered appropriate, reference numerals may be repeated among the figures to indicate corresponding or analogous elements. In addition, numerous specific details are set forth in order to provide a thorough understanding of the example embodiments described herein. However, it will be understood by those of ordinary skill in the art that the example embodiments described herein may be practiced without these specific details. In other instances, well-known methods, procedures and components have not been described in detail so as not to obscure the example embodiments described herein. Also, the description is not to be considered as limited to the scope of the example embodiments described herein.

FIG. 1 shows a simplified block diagram of components including internal components of a portable electronic device according to one embodiment.

The portable electronic device 100 includes multiple components such as a processor 102 that controls the operations of the portable electronic device 100. Communication functions, including data communications, voice communications, or both may be performed through a communication subsystem 104. Data received by the portable electronic device 100 may be decompressed and decrypted by a decoder 106. The communication subsystem 104 receives messages from and sends messages to a wireless network 150.

The wireless network 150 may be any type of wireless network, including, but not limited to, data-centric wireless networks, voice-centric wireless networks, and dual-mode networks that support both voice and data communications over the same or similar physical base stations.

The portable electronic device 100 may be a battery-powered device and as shown includes a battery interface 142 for receiving one or more rechargeable batteries 144.

The processor 102 also interacts with additional subsystems such as a Random Access Memory (RAM) 108, a flash memory 110, a display 112 with a touch-sensitive overlay 114 connected to an electronic controller 116 that together include a touch-sensitive display 118, an actuator assembly 120, one or more optional force sensors 122, an auxiliary input/output (I/O) subsystem 124, a data port 126, a speaker 128, a microphone 130, short-range communications 132 and other device subsystems 134.

User-interaction with the graphical user interface may be performed through the touch-sensitive overlay 114. The processor 102 may interact with the touch-sensitive overlay 114 via the electronic controller 116. Information, such as text, characters, symbols, images, icons, and other items that may be displayed or rendered on a portable electronic device, is displayed on the touch-sensitive display 118 via the processor 102.

The processor 102 may also interact with an accelerometer 136 as shown in FIG. 1. The accelerometer 136 may include a cantilever beam with a proof mass and suitable deflection sensing circuitry. The accelerometer 136 may be utilized for detecting direction of gravitational forces or gravity-induced reaction forces acting on the portable electronic device 100.

To identify a subscriber for network access according to the present embodiment, the portable electronic device 100 may use a Subscriber Identity Module or a Removable User Identity Module (SIM/RUIM) card 138 inserted into a SIM/RUIM interface 140 for communication with a network such as the wireless network 150.

Alternatively, user identification information may be programmed into the flash memory 110.

The portable electronic device 100 also includes an operating system 146 and software components 148 that are executed by the processor 102 and which may be stored in a persistent store such as the flash memory 110. Additional applications may be loaded onto the portable electronic device 100 through the wireless network 150, the auxiliary I/O subsystem 124, the data port 126, the short-range communications subsystem 132, or any other suitable device subsystem 134.

In use, a received signal such as a text message, an e-mail message, or web page download may be processed by the communication subsystem 104 and input to the processor 102. The processor 102 then processes the received signal for output to the display 112 or alternatively to the auxiliary I/O subsystem 124. A subscriber may also compose data items, such as e-mail messages, for example, which may be transmitted over the wireless network 150 through the communication subsystem 104.

For voice communications, the overall operation of the portable electronic device 100 is similar. The speaker 128 outputs audible information converted from electrical signals, and the microphone 130 converts audible information into electrical signals for processing.

Turning now to FIGS. 2 to 10, illustrated generally therein is a portable electronic device 200 according to some embodiments.

Figures 2, 3:
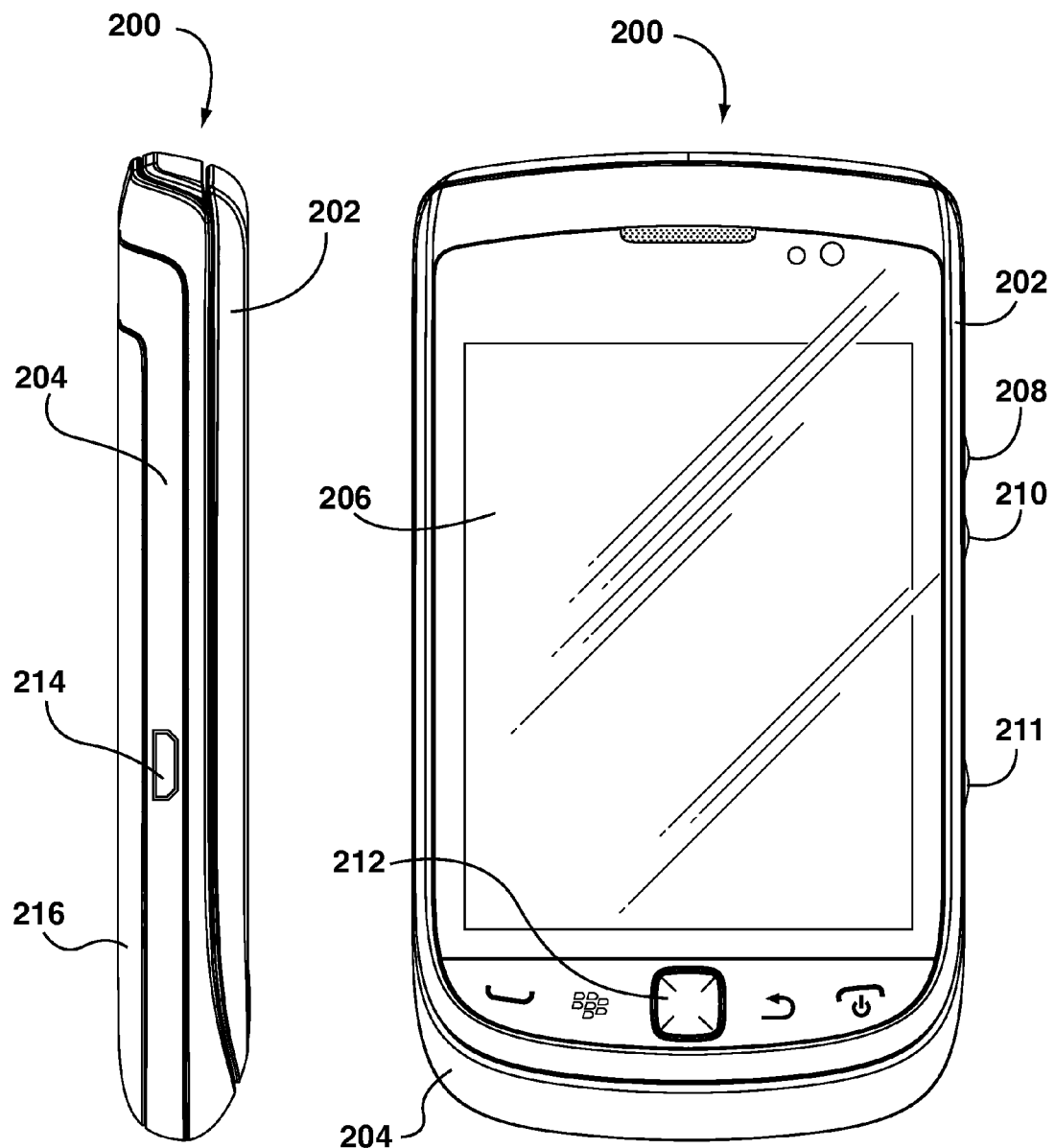
FIG. 2 is a first side view of a portable electronic device according to one embodiment shown in a closed position.
FIG. 3 is a front view of the portable electronic device of FIG. 2.
Figures 6, 7:
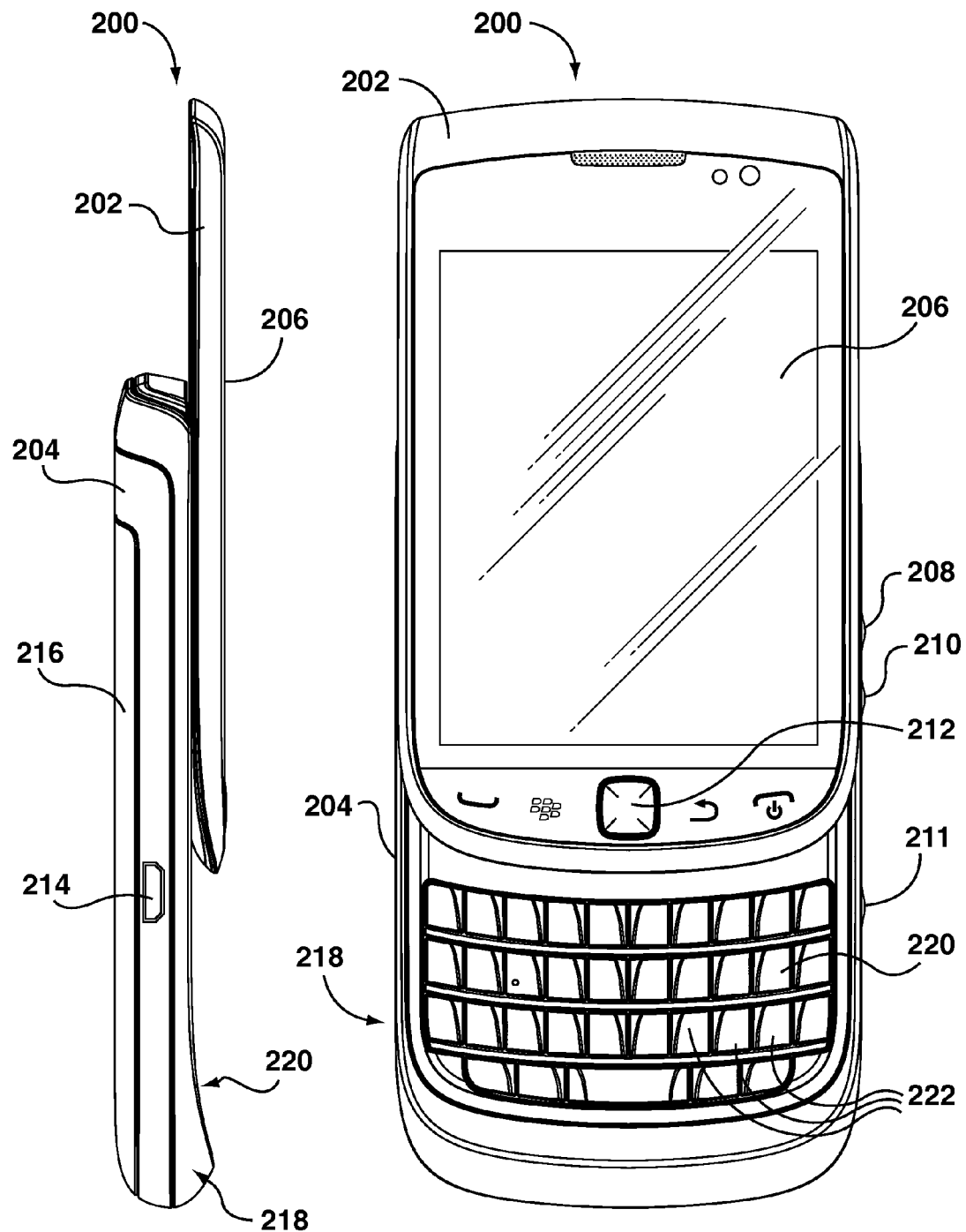
FIG. 6 is a first side view of the portable electronic device of FIG. 2 shown in an open position.
FIG. 7 is a front view of the portable electronic device of FIG. 6.
Figures 8, 9:
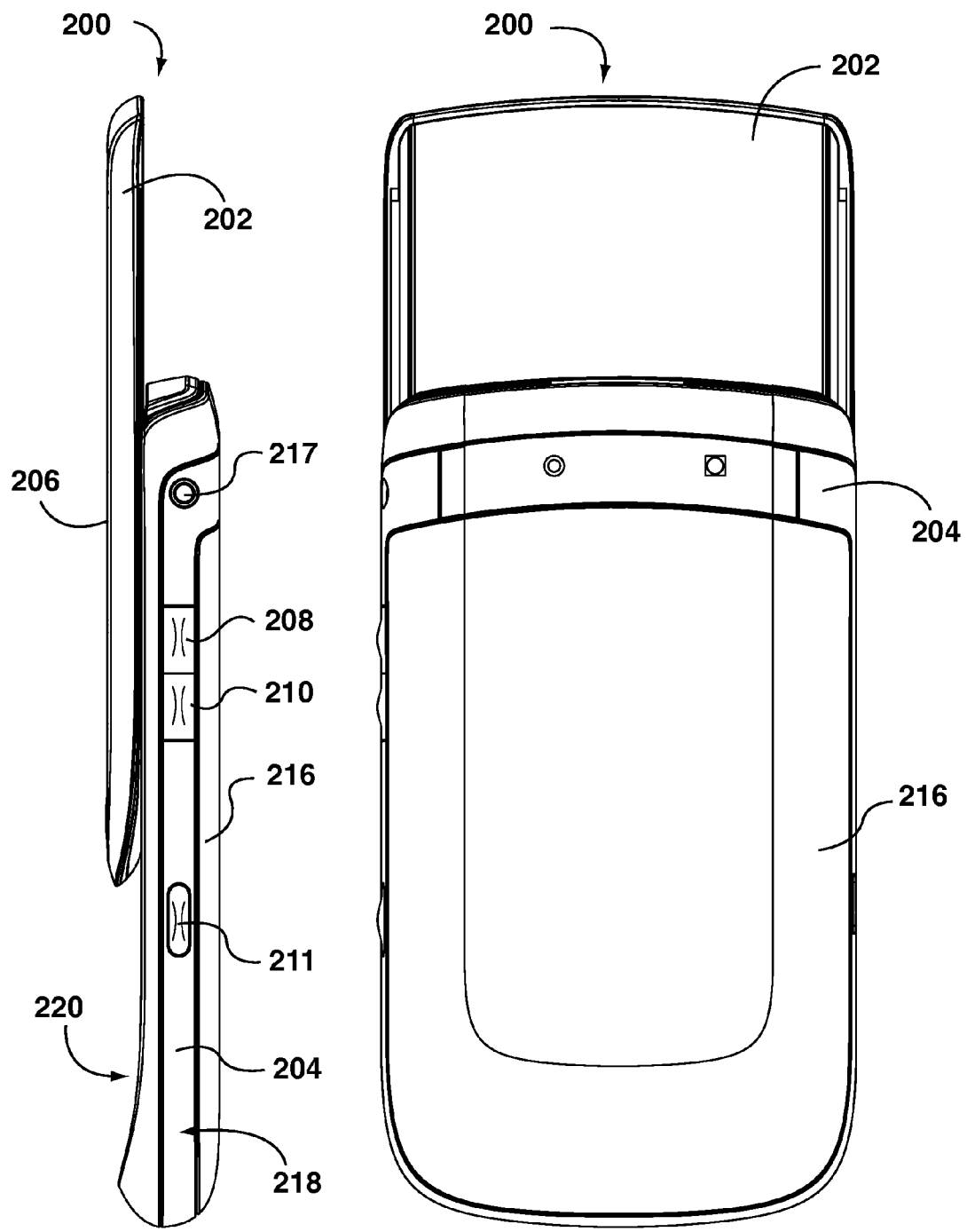
FIG. 8 is a second side view of the portable electronic device of FIG. 6.
FIG. 9 is a back view of the portable electronic device of FIG. 6.
Figure 10:
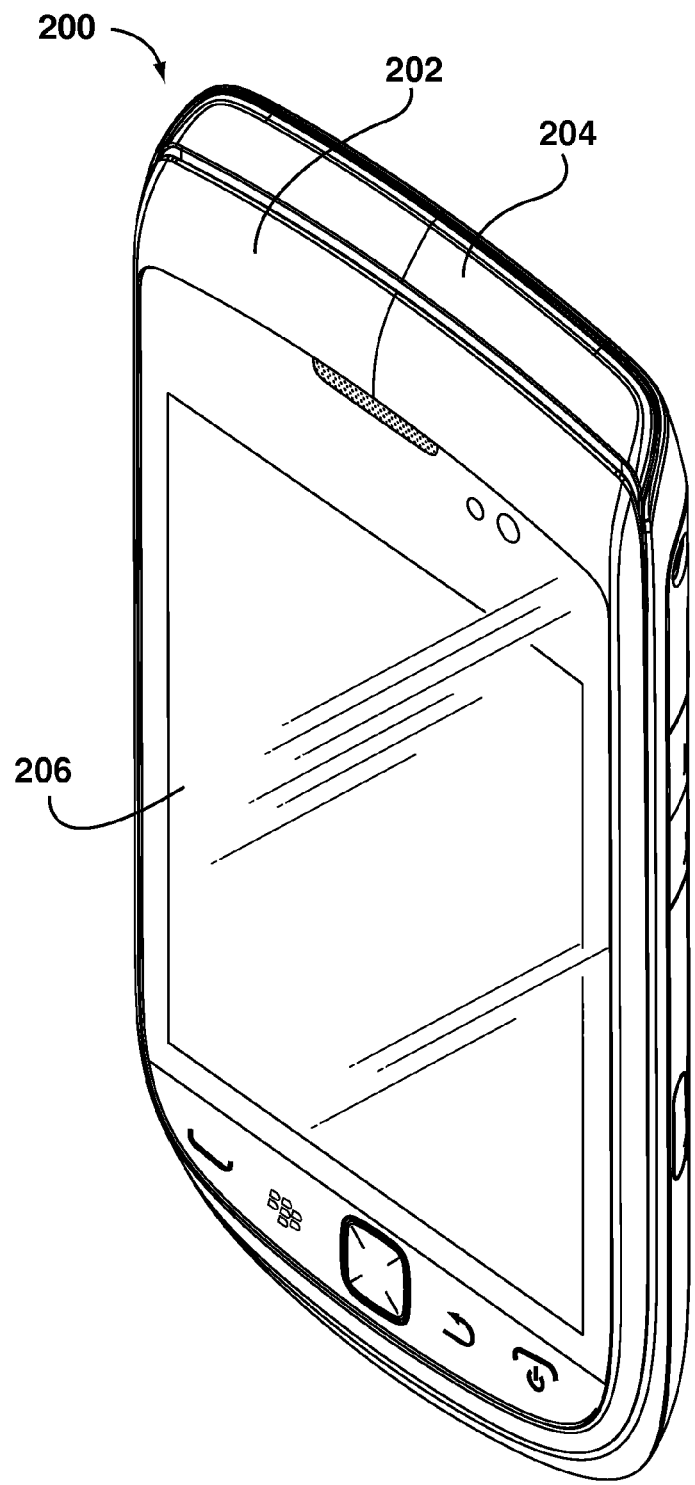
FIG. 10 is a perspective view of the portable electronic device of FIG. 2 shown in the closed position.
Figure 11:
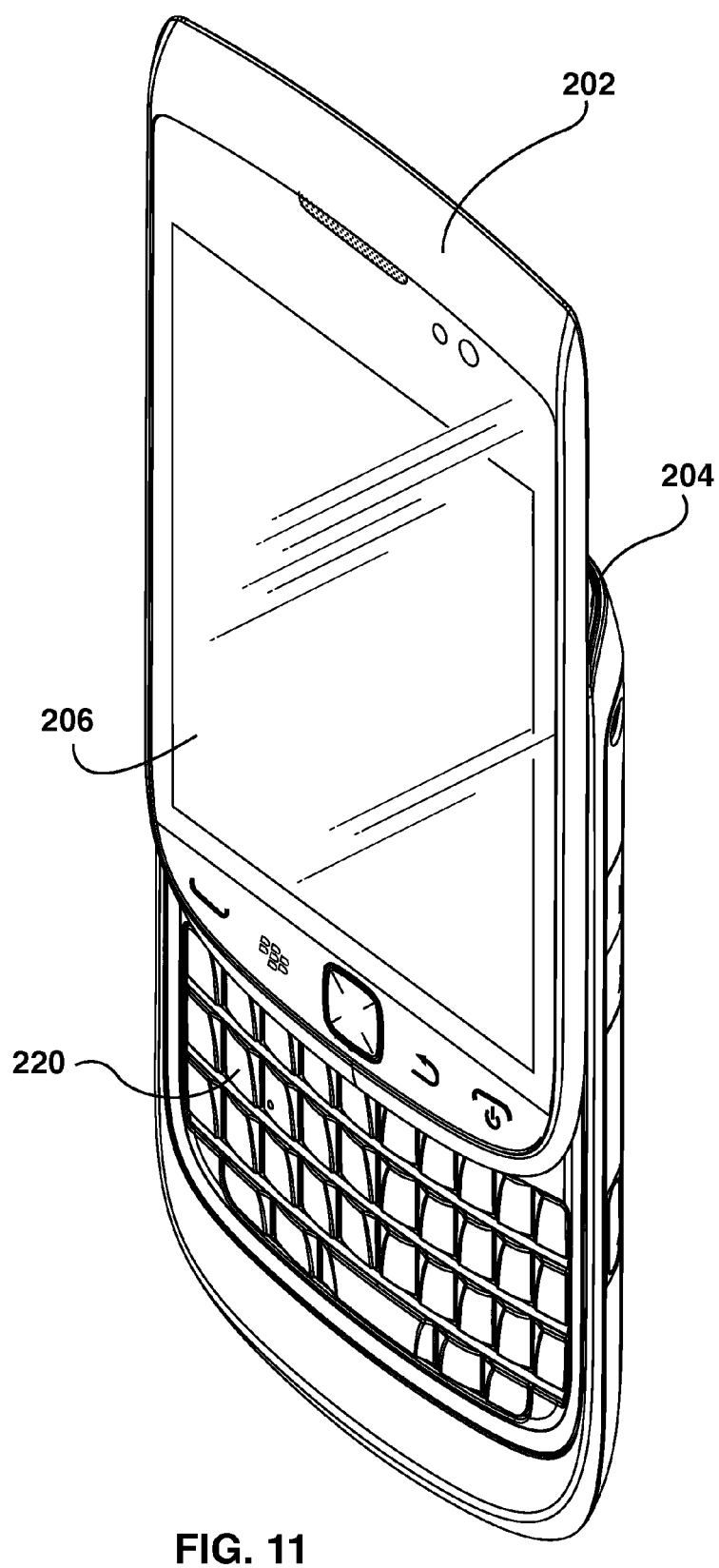
FIG. 11 is a perspective view of the portable electronic device of FIG. 6 shown in the open position.

The portable electronic device generally includes an upper housing 202 (or sliding portion) and a rear housing 204 (or base portion). The upper housing 202 and lower or rear housing 204 are coupled together and are slidable between a closed position (as shown in FIG. 2) and an open position (e.g. as shown in FIG. 6).

As shown, the upper housing 202 generally includes a display 206, which could be an LCD display and which may have touch screen capabilities.

As shown, one or both of the upper housing 202 and lower housing 204 may include one or more input apparatus, such as navigation keys or buttons, a physical or virtual keyboard, a trackpad, trackball, multimedia keys, etc.

For example, the upper housing 202 as shown includes an auxiliary input device 212. As shown, the auxiliary input device may be an optical navigation module (e.g. a trackpad) that responds to user interaction, and which may be used for navigating around the display screen 206, to select objects on the display screen, or for other purposes. In some other embodiments, the auxiliary input device 212 may be a mechanical device that responds to user interaction (e.g. a trackball).

The display 206 and the auxiliary input device 212 are generally disposed on a front of the upper housing 202 and exposed for user accessibility when the portable electronic device 200 is in either of the open or closed positions.

The upper housing 202 may also include other input devices, such as a dedicated phone application button, a dedicated "disconnect call" button, a home screen button, etc. In various embodiments, these input devices may include optical sensors, mechanical buttons, or both.

Turning now to the rear housing 204, the rear housing 204 may include various buttons and other controls, such as buttons 208 and 210, and which could be used for navigation, to control volume or for other purposes.

The rear housing 204 could also include one or more application buttons 211 that can be used to automatically launch a particular application on the portable electronic device 200 (e.g. a camera application, a phone application, etc.). In some embodiments, the button 211 may be configurable by a user (e.g. the user may be able to select the particular application launched by the button 211).

As shown in FIGS. 2 and 6, the rear housing 204 could also include one or more input or output ports, (e.g. I/O ports), such as a microUSB port 214. In some examples, the port 214 may be used for data communication with the portable electronic device 200, for charging of a battery (not shown) on the device 200 or for both.

As shown, the rear housing 204 may also include a battery cover 216 for covering the battery (not shown). In some embodiments, the battery cover 216 may be removable. In other embodiments, the battery cover 216 may be permanently affixed to the device.

In some embodiments, the rear housing 204 may also include an audio jack 217. The audio jack 217 may be used to couple the portable electronic device 200 to a speaker, a microphone, or both, for example for use in voice communication.

Turning now to FIGS. 6 to 9, as shown when the portable electronic device 200 is in the open position, a keypad 220 is exposed on a lower portion 218 of the rear housing 204. The keypad 220 generally include a plurality of alphanumeric keys 222, which may be positioned in a plurality of rows and columns. In some embodiments, the keys 222 may represent the alphabet and may be arranged with a standard keyboard layout (e.g. QWERTY, QWERTZ, DVORAK, etc.)

As shown in FIGS. 2 to 5, when the portable electronic device 200 is in the closed position, the keypad 220 is covered by the upper housing 202. This may be beneficial as it may protect the keypad 220 when not in use, and may also inhibit undesired keys from being pressed when the user is carrying the portable electronic device 200 (e.g. in a user's pocket). However, in some cases (e.g. when the display 206 is a touchscreen) the user may be able to perform functions on the portable electronic device 200 while closed by interacting with the display screen (e.g. using buttons 208, 210, 211, the auxiliary input device 212, the display screen 206 itself, etc.).

When the portable electronic device 200 is in the open position (as shown in FIGS. 6 to 9), the keypad 220 is exposed for user accessibility.

In some embodiments, the display 206 may be a touch-sensitive display. The touch-sensitive display may be a capacitive touch-sensitive display, for example, and a user's touch on the touch-sensitive display may be determined by determining an X and Y location of the touch, with the X location determined by a signal generated as a result of capacitive coupling with a touch sensor layer and the Y location determined by the signal generated as a result of capacitive coupling with another touch sensor layer. Each of the touch-sensor layers provides a signal to a controller that represents the respective X and Y touch location values. Thus a feature such as a virtual button or other feature displayed on the touch-sensitive display may be selected by a mapping of the touch location to a feature on the touch-sensitive display.

In some embodiments, the portable electronic device 200 is generally taller than it is wide. In such embodiments, as the portable electronic device 200 moves between the open position and the closed position, the upper housing 202 and rear housing 204 move along a longitudinal axis of the portable electronic device 200.

Figure 12:
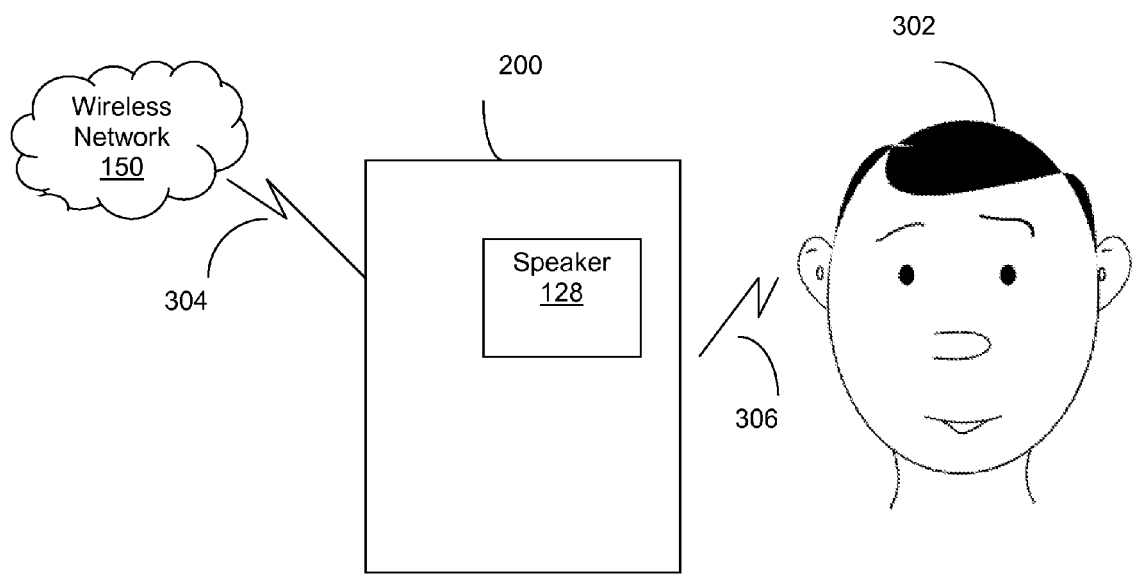
FIG. 12 is a schematic diagram showing the portable electronic device of FIGS. 2 to 11 in communication with a wireless network and a user.

Reference is now made to FIG. 12, which illustrates the portable electronic device 200 in communication with a wireless network 150 and a user 302. Portable electronic devices, such as portable electronic device 200, typically communicate with a wireless network, such as wireless network 150, using a radio frequency (RF) link 304. The quality of the RF link 304 is typically dependant on the (i) the RF power generated by the portable electronic device 200, and (ii) the radiation pattern of the portable electronic device 200. Typically, increasing the RF power improves the sensitivity and range of the portable electronic device.

The radiation pattern of a portable electronic device (i.e. portable electronic device 200) is typically dependant on the geometric shape of the portable electronic device. Where a portable electronic device, such as portable electronic device 200, is moveable between multiple positions that alter the geometric shape of the portable electronic device (i.e. between an open position and a closed position), the portable electronic device will have different radiation patterns in each of the positions.

For example, portable electronic device 200 will have one radiation pattern in the open position, and a different radiation pattern in the closed position. Typically, the radiated power seen by the wireless network (i.e. wireless network 150) is higher when the portable electronic device 200 is in the open position, and lower when the portable electronic device 200 is in the closed position (assuming that the portable electronic device 200 is transmitting at the same RF level in both positions).

Where the portable electronic device 200 is used for voice communications, the RF link 304 may carry audio information. The audio information received by the portable electronic device via RF link 304 is decoded and converted into audio information that may be output by the speaker 128. The audio information output by the speaker 128 is typically transmitted over an audio link 306 to the user's 302 ear.

Hearing impaired individuals typically use a hearing aid apparatus, such as a hearing aid or cochlear implant, to compensate for impaired hearing. When a hearing aid apparatus is used in conjunction with a portable electronic device (i.e. portable electronic device 200), the RF radiation produced by the portable electronic device may cause interference with the hearing aid apparatus. This interference may be a buzzing, humming, or whining noise that can make understanding speech difficult, if not impossible. In severe cases, the interference may make the portable electronic device 200 completely unusable to hearing impaired individuals for voice communications.

Figure 13:
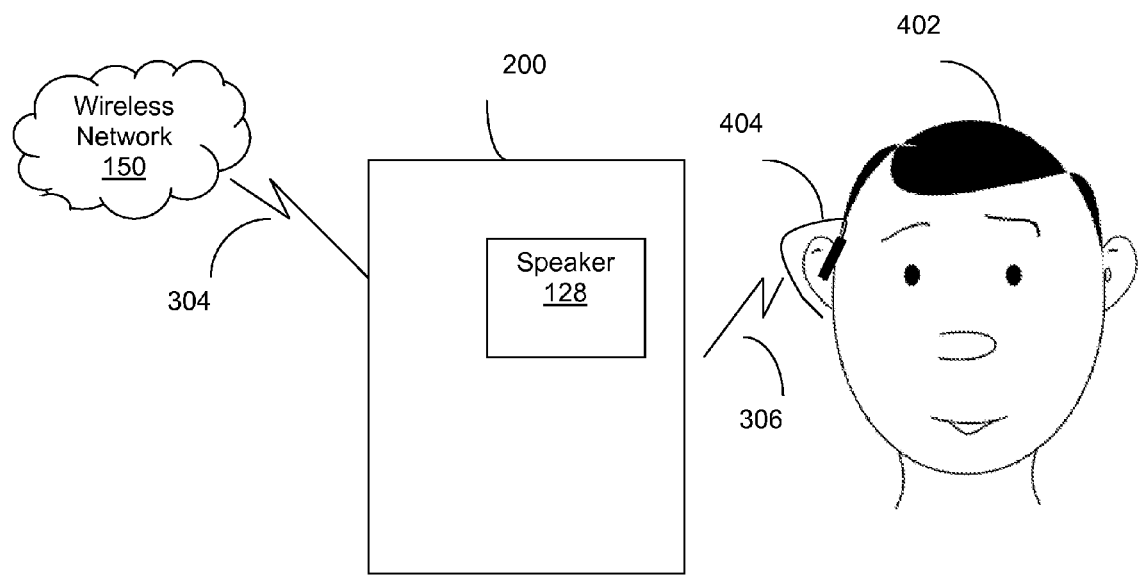
FIG. 13 is a schematic diagram showing the portable electronic device of FIGS. 2 to 11 in communication with a wireless network and a hearing impaired user.

Accordingly, reference is now made to FIG. 13, which illustrates the portable electronic device 200 in communication with a wireless network 150 and being configured to work with a hearing impaired user 402 using a hearing aid.

As shown in FIG. 12, the portable electronic device 200 communicates with the wireless network 150 using the radio frequency (RF) link 304.

Where the portable electronic device 200, is used for voice communications the RF link 304 may carry audio information. The audio information received by the portable electronic device 200 via RF link 304 is decoded and converted into audio information that may be output by the speaker 128. The audio information output by the speaker 128 is typically transmitted over an audio link 306 to the hearing impaired user 402.

However, the hearing impaired user 402 does not receive the audio information directly via the audio link 306. Instead, the information is received by a hearing apparatus 404 and then converted into a form suitable for reception by the hearing impaired user's 402 ear.

As described above, the RF radiation generated by the portable electronic device 200 may cause interference with the hearing aid apparatus 404. Specifically, some of the RF energy generated by the portable electronic device 200 may be coupled into the hearing aid apparatus 404. This typically causes distortion in the audio information which may make it difficult for the hearing impaired user 402 to understand the audio information.

With this issue in mind, on Jul. 23, 2003, the US Federal Communications Commission (FCC) adopted new rules requiring wireless device manufacturers and service providers to produce digital wireless devices that are compatible with hearing aid apparatuses. Digital wireless devices must now be rated as to how much interference they are likely to cause to a hearing aid apparatus (i.e. a hearing aid).

Specifically, the FCC defines Hearing Aid Compatibility (HAC) for digital wireless devices in terms of RF emissions—the "M" (microphone) rating, and telecoil coupling—the "T" (t-coil) rating.

The rating scale ranges from 1 to 4. The four possibilities are: M1 or T1 (poor), M2 or T2 (fair), M3 or T3 (good) and M4 or T4 (excellent). Only wireless devices rated 3 or 4 may be labeled as "hearing aid compatible" when sold. Wireless devices that are rated 1 or 2 are deemed unacceptable. The specifics of the HAC standard are set out in ANSI 63.19.

As a result of the new FCC rules, many portable electronic devices are being designed to comply with the HAC standards. Design complexities arise, however, where the portable electronic device is movable between multiple positions that alter the geometric shape of the portable electronic device. Specifically, as described above, each position has a different radiation pattern, and each radiation pattern alters the amount of RF radiation coupled to the hearing aid apparatus.

In some embodiments, a device (e.g. portable electronic device 200) may meet the HAC standards when in the closed position, but fail to meet the HAC standards (e.g. the radiation levels are too high) when in the open position. In these embodiments, the portable electronic device 200 may include a gain adjustment module that adjusts the RF power when the portable electronic device 200 is in the open position.

Figure 14:
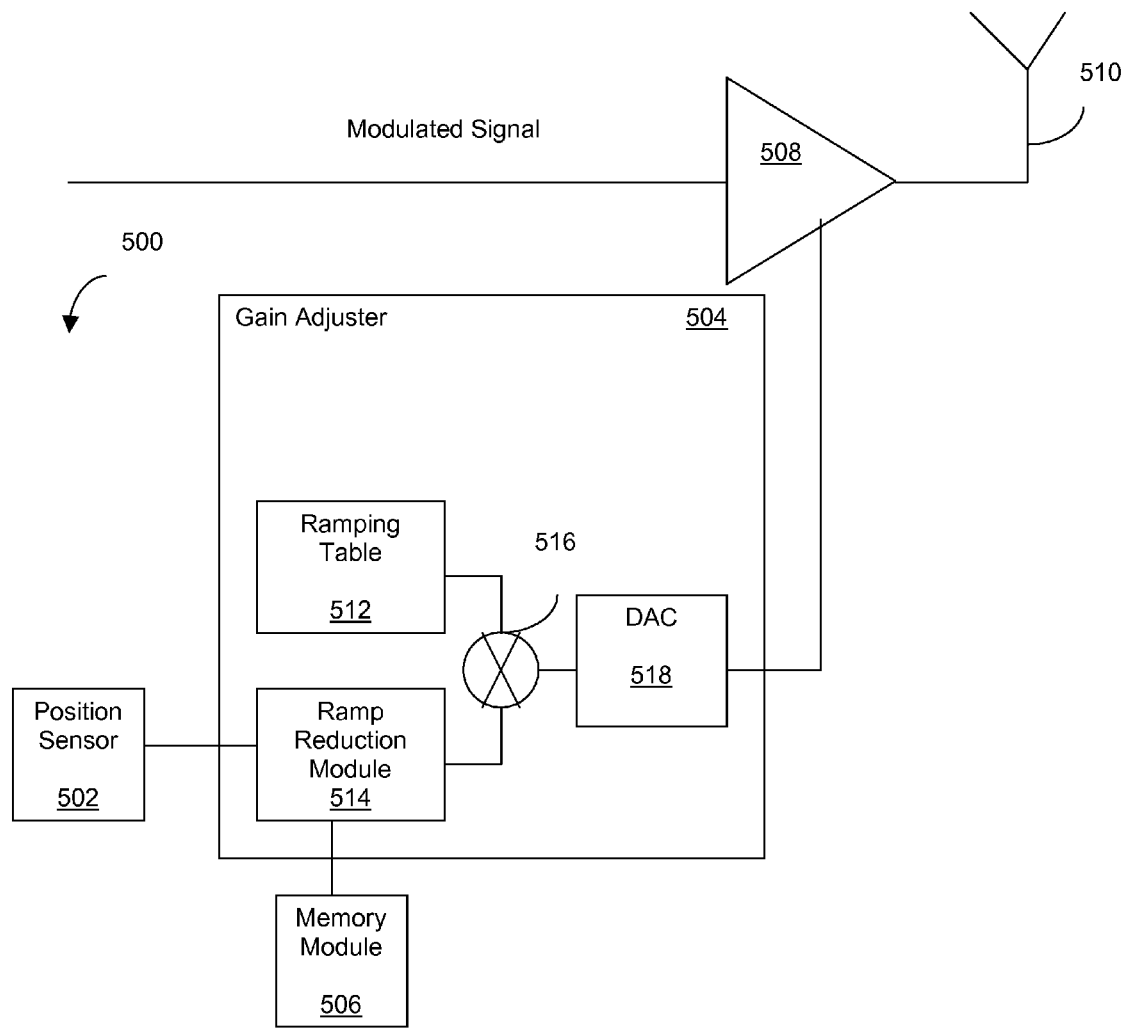
FIG. 14 is a block diagram of a gain adjustment module in accordance with at least one embodiment.

Reference is now made to FIG. 14, which illustrates a gain adjustment module 500 in accordance with some embodiments. In this embodiment, the gain adjustment module 500 reduces the RF power generated by the portable electronic device 200 when the portable electronic device 200 is in the open position. The gain adjustment module 500 includes a position sensor 502, a gain adjuster 504, and a memory module 506.

The position sensor 502 detects the position of the portable mobile device 200 and outputs a sensor output indicative of the position of the portable mobile device 200. For example, in one embodiment, the position sensor 502 may detect whether the portable mobile device 200 is in the open or closed position and output this information to the gain adjuster 504.

In some embodiments, the position sensor 502 may be a Hall Effect Sensor (not shown) positioned in either the upper housing 202 or the rear housing 204. As is known to those of skill in the art, a Hall Effect Sensor is a transducer that varies its output voltage in response to changes in magnetic field The Hall Effect Sensor detects the position of the portable mobile device 200 by detecting the presence or absence of a magnetic field generated by a magnet (not shown) positioned in the other of the upper housing 202 or the rear housing (i.e. the housing portion not containing the Hall Effect Sensor). Typically, the Hall Effect Sensor is positioned in the rear housing 204 and the magnet is placed in the upper housing 202. It will be evident to a person of skill in the art that the position sensor 502 may be implemented using other known components and techniques.

The gain adjuster 504 receives the output of the position sensor 502 and determines whether the portable electronic device 200 is in the open position or the closed position. When the gain adjuster 504 determines that the portable electronic device 200 is in the open position, the gain adjuster 504 can adjust the gain applied to the outgoing signal so that it will comply with HAC standards.

Typically, when information is ready to be transmitted to the wireless network 150 by the portable electronic device 200, the information is modulated onto a carrier signal having a specific frequency. This modulated signal is then sent to a power amplifier 508 that amplifies the modulated signal to an appropriate level for transmission. The amplified signal is then sent to an antenna 510 for transmission. In some embodiments the level of amplification applied to the modulated signal by the amplifier 508 is determined based on the specific carrier frequency. This information may be stored in what is called a ramp scaling factor table.

When the gain adjuster 504 determines that the portable electronic device 200 is in the open position, the gain adjuster 504 reduces the selected ramp scaling factor before it is supplied to the power amplifier 508. This has the effect of reducing the RF power generated by the portable electronic device 200.

In one embodiment, the gain adjuster 504 includes a ramping table 512, a ramp reduction module 514, a combiner 516 and a digital to analog converter (DAC) 518. The ramping table 512 outputs the gain to be applied to the outgoing signal; the ramp reduction module 514 determines and outputs the appropriate reduction level when the portable electronic device 200 is in the open position; the combiner 516 combines the output of the ramping table 512 and the output of the ramp reduction module 514 to output a digital gain control signal; and the digital to analog converter (DAC) 518 converts the digital gain signal into an analog gain control signal.

The analog gain control signal output by the digital to analog converter (DAC) 518 is sent to the power amplifier 508 and controls the amplification applied to the modulated signal.

In some embodiments, the gain adjuster 504 reduces the RF energy by a fixed amount (e.g. 2 dB) independent of the operating conditions (i.e. transmit frequency) of the portable electronic device 200. In other embodiments, the RF energy reduction may be based on the current transmit frequency of the portable electronic device 200. For example, where the portable electronic device 200 operates within the PCS band (e.g. 1850-1910 MHz and 1930-1990 MHz) the PCB band may be divided into groups of channels and each group is assigned a maximum power level reduction. An exemplary PCS channel grouping is shown in Table 1. In the example shown in Table 1, the frequencies are grouped according to frequency channel number.

TABLE 1

| Channel Group | Maximum Power Reduction |
|---|---|
| 512-610 | 2 dB |
| 611-710 | 1.5 dB |
| 711-810 | 1 dB |

In some embodiments, the channel grouping and associated maximum power reduction levels may be stored in a table in the memory module 506. In other embodiments, the table in the memory module 506 may store maximum power reduction levels for more than one band (i.e. PCS, GSM).

In any these embodiments, when the gain adjuster 504 receives a request from the main processor 102 to transmit at a particular frequency, and the position sensor 502 output indicates that the portable electronic device 200 is in the open position, the gain adjuster 504 communicates with the memory module 506 to determine the appropriate maximum power reduction level for the specific transmit frequency. The memory module 506 may be any suitable memory module such as a NVRAM (non-volatile random access memory) or RAM (read only memory).

Figure 15:
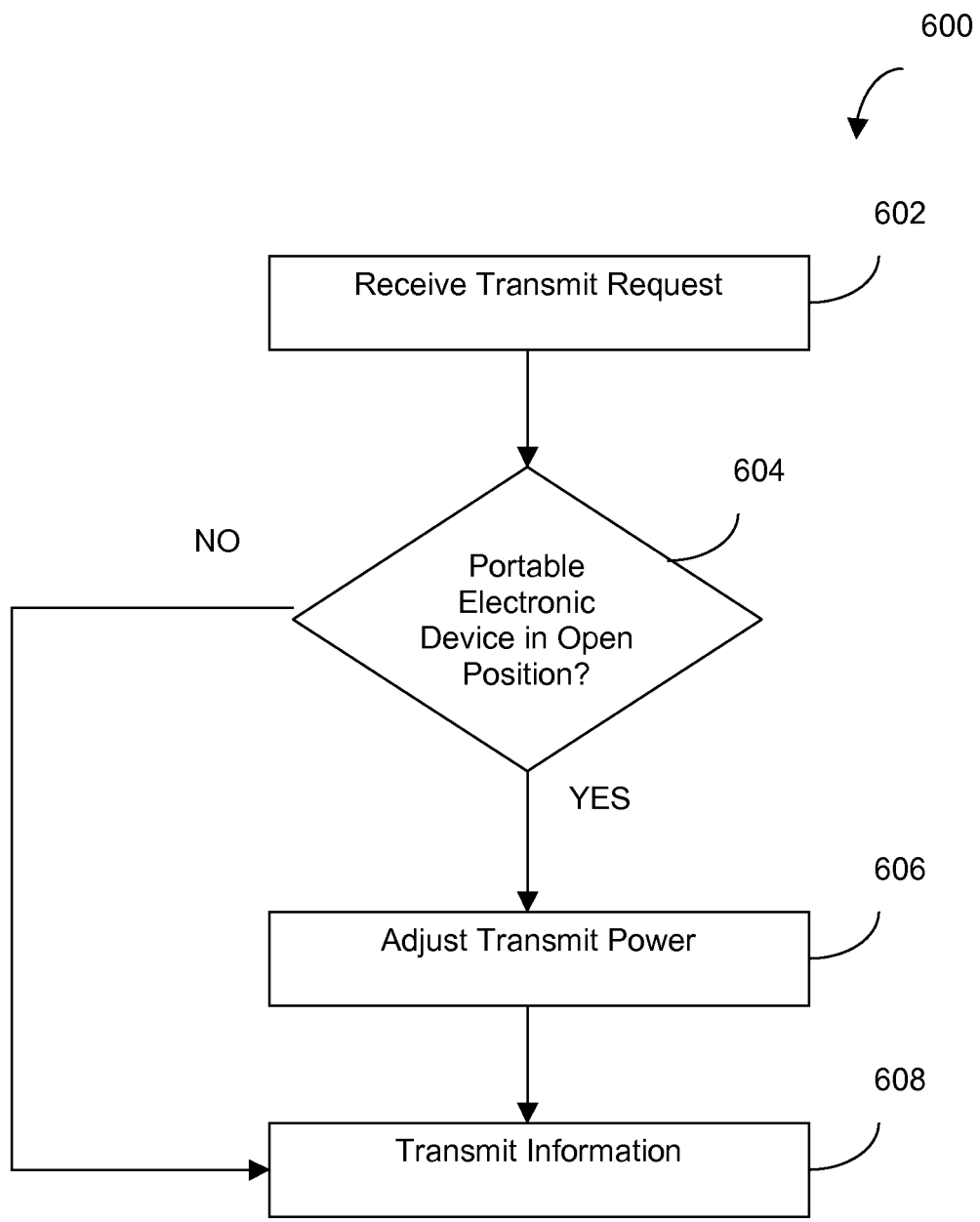
FIG. 15 is a flowchart of a method of adjusting the RF power to comply with Hearing Aid Compatibility (HAC) standards in accordance with at least one embodiment.

Reference is now made to FIG. 15, which illustrates a method 600 of adjusting the RF radiation of a portable electronic device 200 so as to comply with HAC standards in accordance with some embodiments. At step 602, the gain adjustment module (i.e. gain adjustment module 500) of the portable electronic device 200 receives a request from the main processor (i.e. main processor 102) to transmit at a particular frequency. After receiving the transmit request, the method 600 proceeds to decision block 604.

At decision block 604, the gain adjustment module (i.e. gain adjustment module 500) determines whether the portable electronic device 200 is in the open position. As described above in reference to FIG. 14, the gain adjustment module (i.e. gain adjustment module 500) may include a position sensor (i.e. a Hall Effect Sensor) that detects the position of the portable electronic device 200 (e.g. whether the portable electronic device 200 is in the closed position or the open position) and outputs this information to the gain adjuster (i.e. gain adjuster 504).

If the portable electronic device 200 is in the open position, then the method 600 proceeds to step 606. If the portable electronic device 200 is not in the open position (e.g. it is in the closed position), then the method 600 proceeds to step 608.

At step 606, the gain adjustment module (i.e. gain adjustment module 500) determines the appropriate RF power adjustment and applies it to the power amplifier control signal. As described above in reference to FIG. 14, in some embodiments the RF power is consistently reduced by a fixed amount (e.g. 2 dB).

In other embodiments, the RF power reduction is determined based on the transmit frequency. For example, as described above in reference to FIG. 14, a table may be stored in a memory module (i.e. memory module 506) that links particular frequencies to particular power reduction levels. In some embodiments, the frequency band used by the portable electronic device 200 may be divided into sub-bands or groups of channels, and each sub-band or group of channels is assigned a specific power reduction level. Once the appropriate power adjustment is determined and applied, the method 600 proceeds to step 608.

At step 608, the gain adjustment module (i.e. gain adjustment module 500) initiates transmission of the RF information. In some embodiments, the gain adjustment module may comprise sufficient hardware to transmit the RF information. In other embodiments, the gain adjustment module may simply provide a signal to another component, such as the communication subsystem 104, to transmit the RF information. Once the RF information has been transmitted, the method 600 ends.

The embodiments described herein, while illustrated as a slider device, can cover other devices such as, for example, devices that are not sliders and/or do not have touch screens.

While the above description provides examples of one or more processes or apparatuses, it will be appreciated that other processes or apparatuses may be within the scope of the accompanying claims.

The invention claimed is:

1. A portable electronic device, comprising:
a rear housing;
an upper housing coupled to the rear housing and slideable relative thereto between a closed position and an open position;
the portable electronic device having a first radiation pattern in the closed position and a second radiation pattern in the open position, the second radiation pattern being different than the first radiation pattern;
a communication subsystem comprising:
a power amplifier configured to:
receive a modulated signal generated by modulating information onto a carrier signal having a frequency;
apply a gain to the modulated signal; and
an antenna coupled to the power amplifier and configured to transmit the modulated signal received from the power amplifier as a radio frequency (RF) signal to a wireless network, the RF signal being transmitted at the frequency of the carrier signal and a power level that causes interference with a hearing aid apparatus when the portable electronic device is in the open position and does not cause interference with the hearing aid apparatus and complies with Hearing Aid Compatibility (HAC) standards when the portable electronic device is in the closed position; and
a gain adjustment module operably coupled to the power amplifier of the communication subsystem, the gain adjustment module comprising a gain adjuster configured to:
in response to detecting that the portable electronic device is in the open position:
determine a gain adjustment based on the frequency of the carrier signal and the power level of the RF signal; and
control the power amplifier to adjust the gain applied to the modulated signal by the gain adjustment such that the power level of the RF signal complies with Hearing Aid Compatibility (HAC) standards.

2. The portable electronic device of claim 1, wherein the gain adjustment module comprises a position sensor configured to detect when the portable electronic device is in the open position.

3. The portable electronic device of claim 2, wherein the position sensor is a Hall Effect Sensor.

4. The portable electronic device of claim 1, further comprising a memory module storing a table associating each of a plurality of frequencies with a specific gain adjustment, and wherein the gain adjustment module is further configured to:
receive, from a processor of the portable electronic device, a request to transmit the RF signal at a new frequency, and wherein the gain adjuster is configured to determine the gain adjustment by selecting, from the table, the specified gain adjustment associated with the new frequency.

5. The portable electronic device of claim 1, wherein the gain adjuster further includes:
a ramping table operable to output the gain to be applied by the power amplifier to the modulated signal,
a ramp reduction module operable to determine and output the gain adjustment in response to determining that the portable electronic device is in the open position,
a combiner operable to combine the output of the ramping table and the output of the ramp reduction module to output a digital gain control signal, and
a digital to analog converter (DAC) operable to convert the digital gain control signal into an analog gain control signal to control the power amplifier to adjust the gain applied to the RF modulated signal.

6. The portable electronic device of claim 1, wherein the gain adjustment is a ramp scaling factor supplied to the power amplifier to adjust the gain applied to the modulated signal, thereby reducing the power level of the RF signal.

7. A method comprising:
at a portable electronic device comprising a rear housing and an upper housing, the upper housing coupled to the rear housing and slideable relative thereto between a closed position and an open position, the portable electronic device having a first radiation pattern in the closed position and a second radiation pattern in the open position, the second radiation pattern being different than the first radiation pattern,
generating, at a communication subsystem of the portable electronic device, a modulated signal by modulating information onto a carrier signal having a frequency;
applying, using a power amplifier of the communication subsystem of the portable electronic device, a gain to the modulated signal;
transmitting the modulated signal as a radio frequency (RF) signal to a wireless network, RF signal being transmitted at the frequency of the carrier signal and a power level that causes interference with a hearing aid apparatus when the portable electronic device is in the open position and does not cause interference with the hearing aid apparatus and complies with Hearing Aid Compatibility (HAC) standards when the portable electronic device is in the closed position; and,
in response to detecting that the portable electronic device is in the open position:
determining a gain adjustment based on the frequency and the power level of the RF signal;

controlling the power amplifier to adjust the gain of the modulated signal by the gain adjustment such that the power level of the RF signal complies with Hearing Aid Compatibility (HAC) standards.

8. The method of claim 7, wherein determining comprises selecting the gain adjustment from a table associating each of a plurality of frequencies with a specific gain adjustment.

9. A non-transitory computer-readable medium storing a computer program, wherein execution of the computer program is for:

at a portable electronic device comprising a rear housing and an upper housing, the upper housing coupled to the rear housing and slideable relative thereto between a closed position and an open position, the portable electronic device having a first radiation pattern in the closed position and a second radiation pattern in the open position, the second radiation pattern being different than the first radiation pattern, generating, at a communication subsystem of the portable electronic device, a modulated signal by modulating information onto a carrier signal having a frequency;

applying, using a power amplifier of the communication subsystem of the portable electronic device, a gain to the modulated signal;

transmitting the modulated signal as a radio frequency (RF) signal to a wireless network, RF signal being transmitted at the frequency of the carrier signal and a power level that causes interference with a hearing aid apparatus when the portable electronic device is in the open position and does not cause interference with the hearing aid apparatus and complies with Hearing Aid Compatibility (HAC) standards when the portable electronic device is in the closed position; and, in response to detecting that the portable electronic device is in the open position:

determining a gain adjustment based on the frequency and the power level of the RF signal;

controlling the power amplifier to adjust the gain of the modulated signal by the gain adjustment such that the power level of the RF signal complies with Hearing Aid Compatibility (HAC) standards.

10. The method of claim 7, further comprising:

receiving, from a processor of the portable electronic device, a request to transmit the RF signal at a new frequency, and wherein determining the gain adjustment comprises selecting, from a memory storing a table associating each of a plurality of frequencies with a specific gain adjustment, the specified gain adjustment associated with the new frequency.

11. The method of claim 7, wherein the gain adjustment is a ramp scaling factor supplied to the power amplifier to adjust the gain applied to the modulated signal, thereby reducing the power level of the RF signal.

12. The non-transitory computer-readable medium of claim 9, further comprising:

receiving, from a processor of the portable electronic device, a request to transmit the RF signal at a new frequency, and wherein determining the gain adjustment comprises selecting, from a memory storing a table associating each of a plurality of frequencies with a specific gain adjustment, the specified gain adjustment associated with the new frequency.

13. The non-transitory computer-readable medium of claim 9, wherein the gain adjustment is a ramp scaling factor supplied to the power amplifier to adjust the gain applied to the modulated signal, thereby reducing the power level of the RF signal.

14. The non-transitory computer-readable medium of claim 9, wherein determining the gain adjustment based on the frequency and the power level of the RF signal comprises selecting the gain adjustment from a table associating each of a plurality of frequencies with a specific gain adjustment.

* * * * *